(12) United States Patent
Seo et al.

(10) Patent No.: US 11,682,614 B2
(45) Date of Patent: Jun. 20, 2023

(54) SEMICONDUCTOR PACKAGE AND PACKAGE SUBSTRATE INCLUDING VENT HOLE

(71) Applicant: SK hynix Inc., Icheon-si (KR)

(72) Inventors: Hyun Chul Seo, Icheon-si (KR); Jun Sik Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/525,388

(22) Filed: Nov. 12, 2021

(65) Prior Publication Data

US 2023/0005829 A1    Jan. 5, 2023

(30) Foreign Application Priority Data

Jun. 30, 2021 (KR) ........................ 10-2021-0086125

(51) Int. Cl.
| H01L 23/498 | (2006.01) |
| H01L 23/00 | (2006.01) |
| H05K 1/02 | (2006.01) |
| H01L 23/31 | (2006.01) |

(52) U.S. Cl.
CPC .... *H01L 23/49827* (2013.01); *H01L 23/3128* (2013.01); *H01L 24/16* (2013.01); *H05K 1/0272* (2013.01); *H01L 2224/16238* (2013.01)

(58) Field of Classification Search
None
See application file for complete search history.

(56) References Cited

U.S. PATENT DOCUMENTS

| 5,729,432 A | * | 3/1998 | Shim ........................ H01L 23/13 257/713 |
| 6,984,866 B1 | * | 1/2006 | Mostafazadeh ... H01L 27/14618 257/434 |
| 2004/0184226 A1 | * | 9/2004 | Hall ........................ H01L 23/24 174/521 |

FOREIGN PATENT DOCUMENTS

| KR | 10-2020-0032360 A | * | 3/2020 |
| KR | 1020200032360 A | | 3/2020 |

* cited by examiner

*Primary Examiner* — Hung K Vu
(74) *Attorney, Agent, or Firm* — William Park & Associates Ltd.

(57) ABSTRACT

A semiconductor package includes a semiconductor chip and a package substrate. The semiconductor chip is mounted on the package substrate. The package substrate includes a dielectric layer through which a vent hole penetrates, trace patterns disposed on the dielectric layer, and a protecting block disposed between the trace patterns and the vent hole.

18 Claims, 12 Drawing Sheets

SEMICONDUCTOR PACKAGE AND PACKAGE SUBSTRATE INCLUDING VENT HOLE

CROSS-REFERENCE TO RELATED APPLICATION

The present application claims priority under 35 U.S.C 119(a) to Korean Application No. 10-2021-0086125, filed on Jun. 30, 2021, which is incorporated herein by reference in its entirety.

BACKGROUND

1. Technical Field

The present disclosure relates to semiconductor package technology, and more particularly, to a semiconductor package and a package substrate including a vent hole.

2. Related Art

A semiconductor package may include a semiconductor chip and a packaging substrate. An encapsulant layer for protecting the semiconductor chip may be molded on the packaging substrate. The semiconductor chip may be mounted on the packaging substrate and may be connected to interconnection circuits of the packaging substrate. The packaging substrate may include a dielectric body and trace patterns. The trace patterns may be formed as metal patterns or conductive patterns. The trace patterns may constitute the interconnection circuits. Because the trace patterns substantially provide paths for application of an electrical signal, application of power, or application of ground to the semiconductor chip, damage to the trace patterns may manifest as malfunctions of the semiconductor package.

SUMMARY

In accordance with an embodiment of the present disclosure is a semiconductor package including a semiconductor chip and a package substrate on which the semiconductor chip is mounted. The package substrate includes a dielectric layer through which a vent hole penetrates, trace patterns disposed on the dielectric layer, and a protecting block disposed between the trace patterns and the vent hole.

In accordance with another embodiment of the present disclosure is a package substrate for a semiconductor package, the package substrate including a dielectric layer through which a vent hole penetrates, trace patterns disposed on the dielectric layer, and a protecting block disposed between the trace patterns and the vent hole.

DETAILED DESCRIPTION

Figure 1:
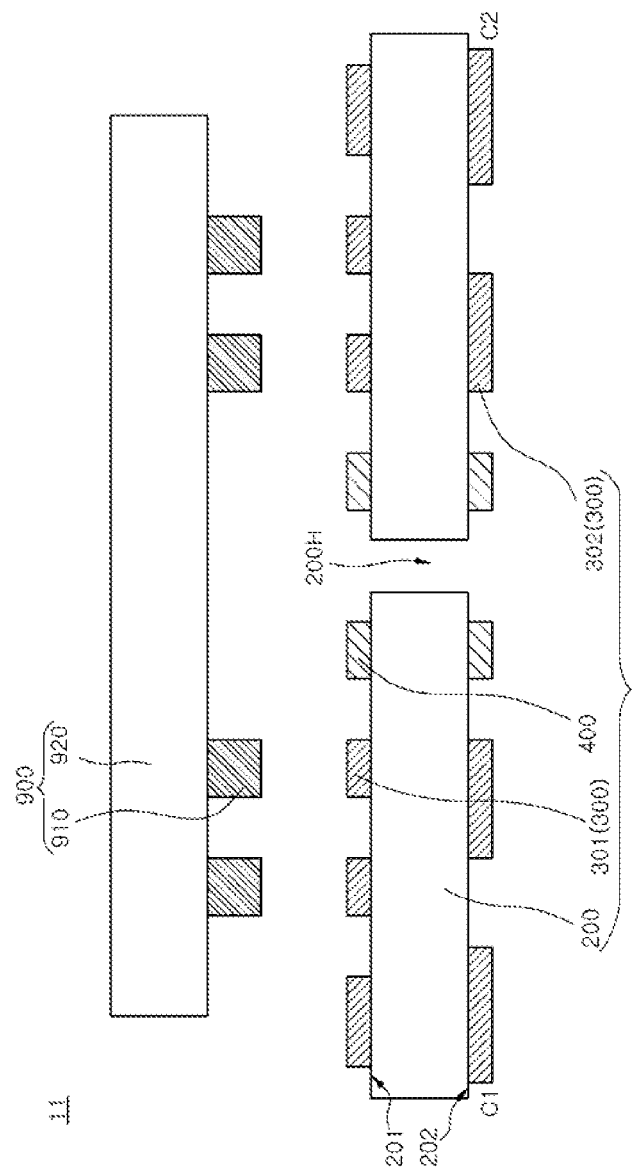
FIGS. 1 and 2 are schematic views illustrating a semiconductor package according to an embodiment of the present disclosure.

The terms used in the description of embodiments of the present disclosure are terms selected in consideration of functions in the presented embodiments, and the meaning of the terms may vary according to the intention or custom of users or operators in the technical field. The meanings of the terms used are in accordance with the defined definitions when specifically defined in the present disclosure. If there is no specific definition, a meaning may be interpreted as the meaning generally recognized by those skilled in the art.

In the description of embodiments of the present disclosure, descriptions such as "first", "second", "side", "top" and "bottom or lower" are to distinguish subsidiary materials, not used to limit the subsidiary materials themselves or to imply any particular order.

A semiconductor device may include a semiconductor substrate or a structure in which plurality of semiconductor substrates are stacked. A semiconductor device may indicate a semiconductor package structure in which a structure in which semiconductor substrates are stacked is packaged. Semiconductor substrates may refer to semiconductor wafers, semiconductor dies, or semiconductor chips on which electronic components and elements are integrated. A semiconductor chip may refer to a memory chip in which a memory integrated circuit such as DRAM, SRAM, NAND FLASH, NOR FLASH, MRAM, ReRAM, FeRAM, FeRAM, or PcRAM is integrated, or a logic die in which a logic circuit is integrated on a semiconductor substrate or a processor such as an ASIC chip, an application processor (AP), a graphic processing unit (GPU), a central processing unit (CPU), or a system on a chip (SoC). A semiconductor device may be applied to information communication devices such as portable terminals, bio or health care related electronic devices, and wearable electronic devices. A semiconductor device may be applied to the Internet of Things.

The same reference numerals may refer to the same elements throughout the present disclosure. The same reference numerals or similar reference numerals may be described with reference to other drawings, even if they are not indicated or described in the corresponding drawings. Further, even if a reference numeral is not indicated, it may be described with reference to other drawings.

Figure 2:
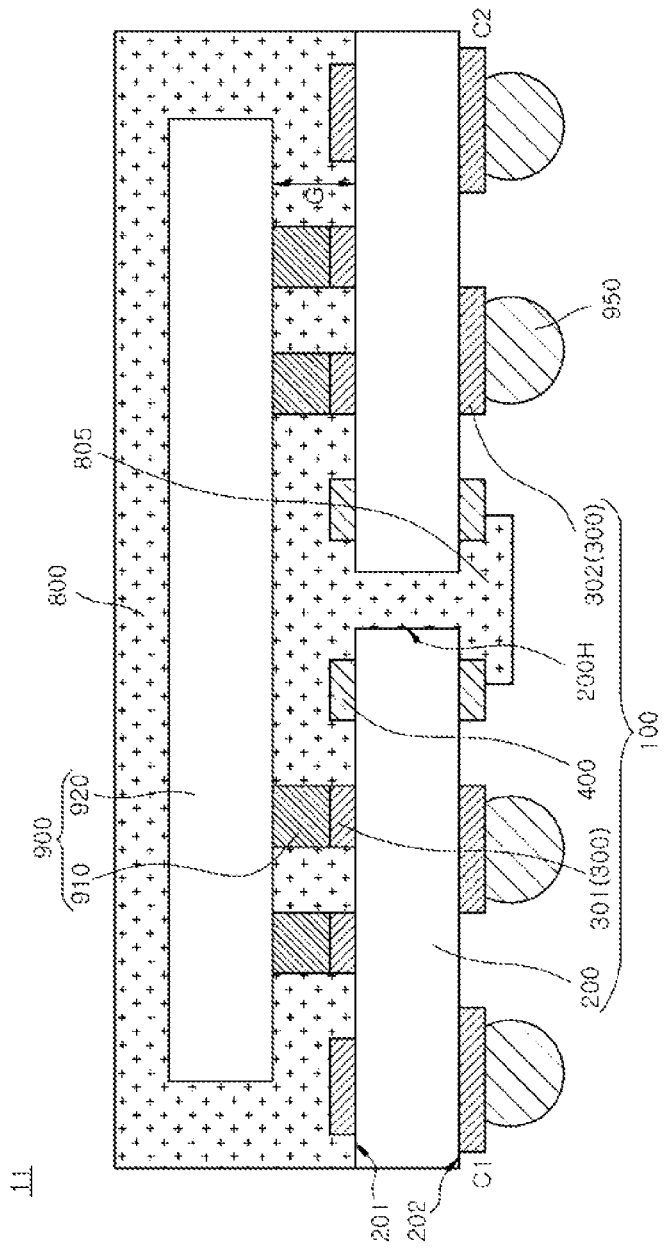

FIGS. 1 and 2 are schematic views illustrating a semiconductor package 11 according to an embodiment of the present disclosure.

Referring to FIG. 1, the semiconductor package 11 may include a semiconductor chip 900 and a package substrate 100. The semiconductor chip 900 may include a semiconductor substrate 920 on which an integrated circuit (IC) such as a memory device is integrated. The semiconductor chip 900 may include conductive bumps 910. The conductive bumps 910 may include a soldering material or a metal material such as copper (Cu). The conductive bumps 910 may be connecting elements or connecting terminals that apply electrical signals to the semiconductor chip 900.

The package substrate 100 may include a dielectric layer 200, trace patterns 300, and a protecting block 400. The package substrate 100 may include interconnection elements that electrically connect the semiconductor chip 900 to other external electronic devices or other electronic components. The package substrate 100 may be introduced in the form of a printed circuit board (PCB).

The dielectric layer 200 of the package substrate 100 may be a layer substantially constituting a substrate body or a core of substrate. The dielectric layer 200 may be a layer including a resin such as epoxy. The dielectric layer 200 may have a first surface 201 and a second surface 202 opposite to each other. The trace patterns 300 and the protecting block 400 may be substantially disposed on the first surface 201 of the dielectric layer 200. Additional trace patterns 300 and an additional protection block 400 may be further disposed on the second surface 202 of the dielectric layer 200. The first trace patterns 301 may be disposed on the first surface 201 of the dielectric layer 200, and the second trace patterns 302 may be disposed on the second surface 202 of the dielectric layer 200. Some of the first trace patterns 301 and some of the second trace patterns 302 may be electrically connected to each other. Conductive vias (not illustrated) may pass through the dielectric layer 200 and electrically connect some of the first trace patterns 301 to some of the second trace patterns 302.

Referring to FIG. 2, outer connectors 950 may be bonded to some of the second trace patterns 302. The outer connectors 950 may electrically connect the semiconductor package 11 to other electronic components such as external devices or module boards. The outer connectors 950 may be formed using connecting elements such as solder balls.

Referring to FIGS. 2 and 1 together, the semiconductor chip 900 may be mounted on the package substrate 100. The semiconductor chip 900 may be fastened or bonded to the package substrate 100 by the conductive bumps 910. The conductive bumps 910 of the semiconductor chip 900 may be bonded to some of the trace patterns 300 of the package substrate 100. The semiconductor chip 900 may be disposed over the first surface 201 of the dielectric layer 200 of the package substrate 100. The conductive bumps 910 of the semiconductor chip 900 may be bonded to some of the first trace patterns 301 of the package substrate 100. The conductive bumps 910 of the semiconductor chip 900 may be bonded to some of the first trace patterns 301 to provide a gap G between the semiconductor chip 900 and the package substrate 100. In some embodiments, the gap G may have a predetermined distance.

The semiconductor package 11 may further include an encapsulant layer 800 to cover and protect the semiconductor chip 900. The encapsulant layer 800 may include an encapsulant such as an epoxy molding compound (EMC). The encapsulant layer 800 may be formed by a molding process using an epoxy molding compound as a molding material and using a mold. The encapsulant layer 800 may be molded to cover the package substrate 100 and the semiconductor chip 900. The encapsulant layer 800 may extend to fill the gap G between the package substrate 100 and the semiconductor chip 900.

During the molding process of forming the encapsulation layer 800, the encapsulant may flow between the package substrate 100 and the semiconductor chip 900. As the encapsulant flows between the package substrate 100 and the semiconductor chip 900, air may be trapped between the package substrate 100 and the semiconductor chip 900, causing undesirable voids. In order to prevent the generation of such voids, the package substrate 100 may include a vent hole 200H. The vent hole 200H may be formed in the form of a through hole substantially penetrating the package substrate 100. The vent hole 200H may be formed in the form of a through hole substantially penetrating the dielectric layer 200. During the molding process of forming the encapsulant layer 800, the encapsulant may flow between the package substrate 100 and the semiconductor chip 900 and may be introduced into the vent hole 200H. The encapsulant may flow out through the vent hole 200H to partially cover the lower surface of the package substrate 100 or the second surface 202 of the dielectric layer 200. Accordingly, the encapsulant layer 800 may include an extension portion 805 that fills the vent hole 200H and protrudes outward beyond the second surface 202 of the dielectric layer 200.

As such, as the encapsulant flows out through the vent hole 200H, air that may exist between the semiconductor chip 900 and the package substrate 100 may be vented out of the semiconductor package 11 through the vent hole 200H. Accordingly, a problem in which the air is trapped or voids are generated between the semiconductor chip 900 and the package substrate 100 may be resolved.

Figure 3:
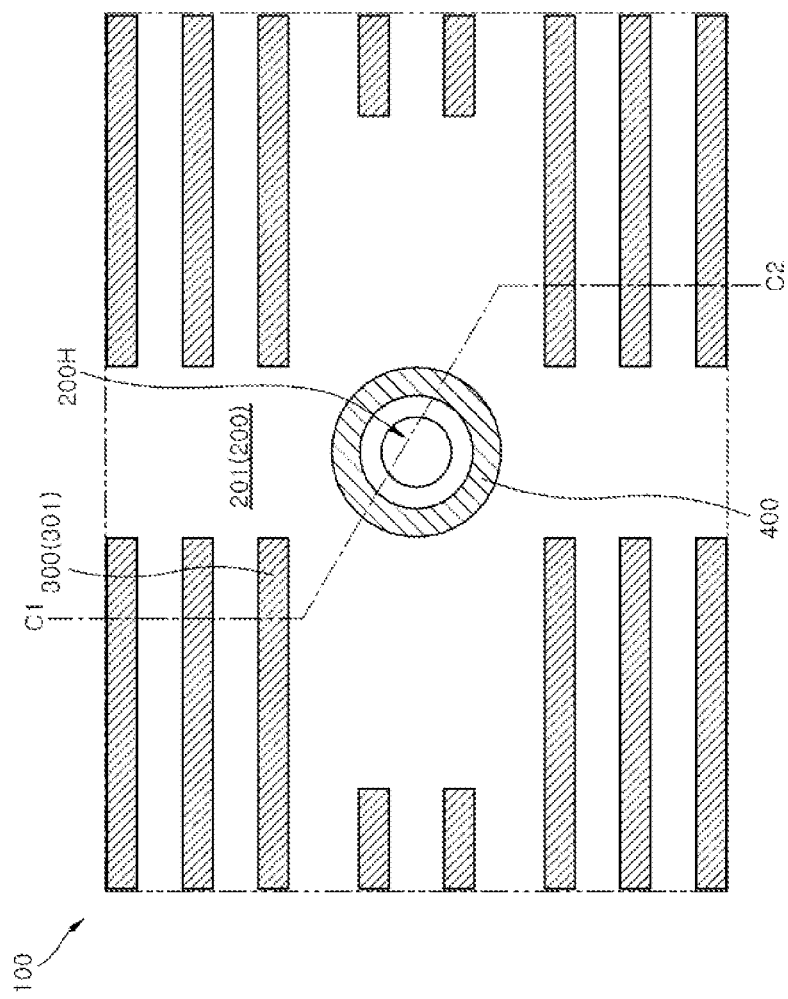
FIG. 3 is a schematic plan view illustrating a planar shape of a package substrate of the semiconductor package of FIG. 1.

FIG. 3 is a schematic plan view illustrating a planar shape of the package substrate 100 of the semiconductor package 11 of FIG. 1. FIGS. 1 and 2 may be cross-sectional views illustrating cross-sectional shapes taken along the line C1-C2 of FIG. 3.

Referring to FIGS. 3 and 1, the package substrate 100 of the semiconductor package 11 according to an embodiment of the present disclosure may include the protecting block 400 disposed between the trace pattern 300 and the vent hole 200H. The protecting block 400 may be a conductive pattern or a metal pattern disposed on the surface of the dielectric layer 200 of the package substrate 100. The protecting block 400 and the trace patterns 300 may include metal patterns having substantially the same thickness. The protecting block 400 and the trace patterns 300 may be formed as plating patterns. The plating patterns may indicate patterns formed by a plating process using a plating material such as copper (Cu).

As illustrated in FIG. 3, the protecting block 400 of the package substrate 100 may be a pattern having a planar shape of a ring pattern or a loop pattern when viewed from a direction perpendicular to the first surface 201 of the dielectric layer 200. The ring pattern of the protecting block 400 may have a shape surrounding the vent hole 200H. The protecting block 400 may be a pattern that separates or isolates the trace patterns 300 disposed around the vent hole 200H from the vent hole 200H.

The protecting block 400 blocks the trace patterns 300 from the vent hole 200H, so that it is possible to prevent the process environment for forming the trace patterns 300 from being affected by the structure including the vent hole 200H or the structural environment caused by the structure. In an etching process for forming the trace patterns 300, the structure including the vent hole 200H or the environment by the structure may cause a phenomenon in which local over-etch is concentrated on some portions of the trace patterns 300 adjacent to the vent hole 200H. Because the protecting block 400 is disposed between the trace patterns 300 and the vent hole 200H, the protecting block 400 may act as a barrier to substantially prevent the local over-etching phenomenon from being caused by the structure including the vent hole 200H or the structural environment.

The protecting block 400 may be disposed on the first surface 201 of the dielectric layer 200 to be spaced apart from the trace patterns 300 or the first trace patterns 301. Accordingly, the protecting block 400 may be formed in an isolated pattern that is electrically isolated and structurally separated from the trace patterns 300 or the first trace patterns 301. Because the protecting block 400 is electrically isolated from the trace patterns 300 or the first trace patterns 301, it is possible for the protecting block 400 to be formed in a metal pattern or a plating pattern. Accordingly, the protecting block 400 may be formed together in the process step of forming the trace patterns 300. When the trace patterns 300 are formed by the plating process, the protecting block 400 may be formed together by the plating process. Accordingly, the protecting block 400 may include a metal pattern having substantially the same thickness as the trace patterns 300. For some embodiments, an additional protecting block may be disposed on the second surface 202 of the dielectric layer 200 to be spaced apart from the trace patterns 300 or the second trace patterns 302.

Even if the protecting block 400 is formed in a metal pattern or a plating pattern, the protecting block 400 might not have an adverse electrical effect on the interconnection circuit constituted by the trace patterns 300. The metal pattern or plating pattern constituting the protecting block 400 may be formed together with the metal patterns or plating patterns providing the trace patterns 300 when the trace patterns 300 are formed. In this way, the protecting block 400 may be formed together in the process step of forming the trace patterns 300. Accordingly, an additional independent process step of independently forming only the protecting block 400 to implement the protecting block 400 on the package substrate 100 may be unnecessary. That is, there is no need to add an independent process step for forming the protecting block 400 in the process of manufacturing the package substrate 100. Accordingly, the number of process steps for manufacturing the package substrate 100 to introduce the protecting block 400 into the package substrate 100 might not be increased.

Figure 4:
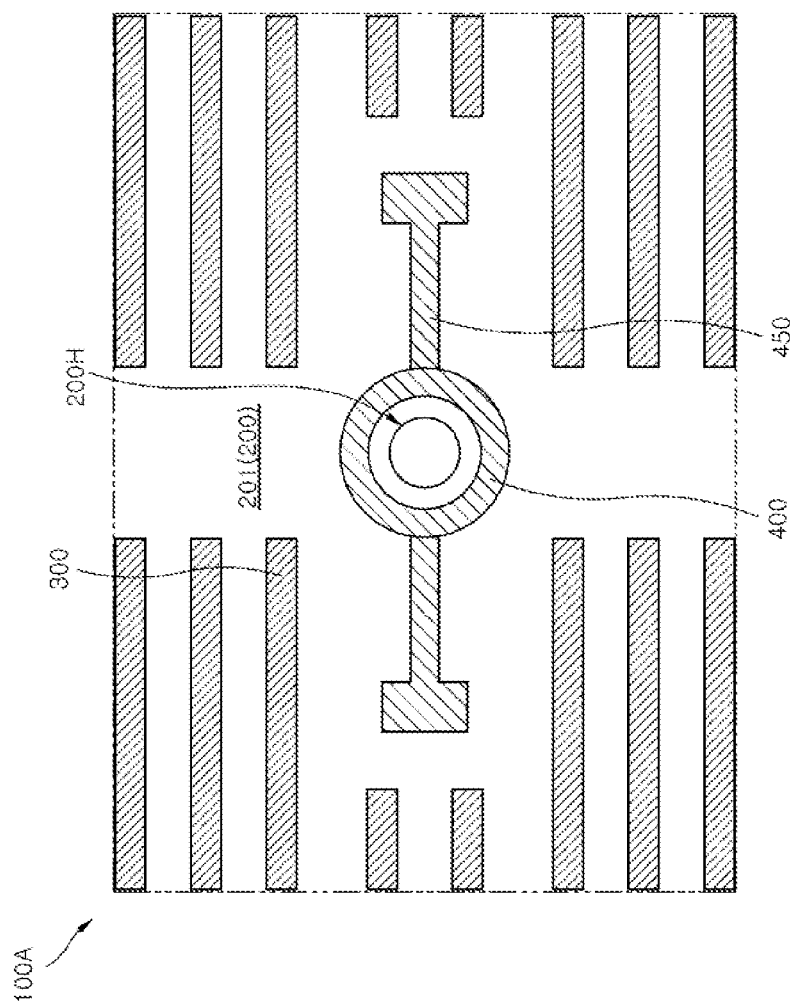
FIG. 4 is a schematic plan view illustrating a planar shape of a package substrate of a semiconductor package according to another embodiment of the present disclosure.

FIG. 4 is a schematic plan view illustrating a planar shape of a package substrate 100A of a semiconductor package according to another embodiment of the present disclosure. In FIG. 4, the same reference numerals as those of FIGS. 1 to 3 may indicate substantially the same elements.

Referring to FIG. 4, the package substrate 100A may include trace patterns 300, a protecting block 400, and a wing pattern 450 on a dielectric layer 200. The protecting block 400 may be an isolated pattern spaced apart from the neighboring trace patterns 300. The protecting block 400 has a smaller contact area with a first surface 201 of the dielectric layer 200 than the trace patterns 300, so that the adhesive force of the protecting block 400 to the first surface 201 of the dielectric layer 200 may be relatively lower than that of the trace patterns 300. Accordingly, the risk that the protecting block 400 is peeled off from the first surface 201 of the dielectric layer 200 may be relatively higher than that of the trace patterns 300.

In order to improve the adhesion of the protecting block 400 to the first surface 201 of the dielectric layer 200, the wing pattern 450 may be formed in a pattern extending from the protecting block 400. The protecting block 400 and the wing pattern 450 may include metal patterns having the same thickness as the trace patterns 300. The wing pattern 450 may be connected to the protecting block 400 and formed in a pattern extending from the protecting block 400.

The wing pattern 450 may be connected to the protecting block 400 and formed in a pattern extending in the direction in which the trace patterns 300 extend. The wing pattern 450 may act as an anchor for fixing the protecting block 400 to the first surface 201 of the dielectric layer 200. When viewed from a direction substantially perpendicular to the first surface 201 of the dielectric layer 200, the wing pattern 450 may be presented as a pattern having hammer-shaped extensions, as pictured in FIG. 4A. The wing pattern 450 may be modified and formed in various types of patterns to improve the adhesion of the protecting block 400 to the dielectric layer 200.

Figure 5:
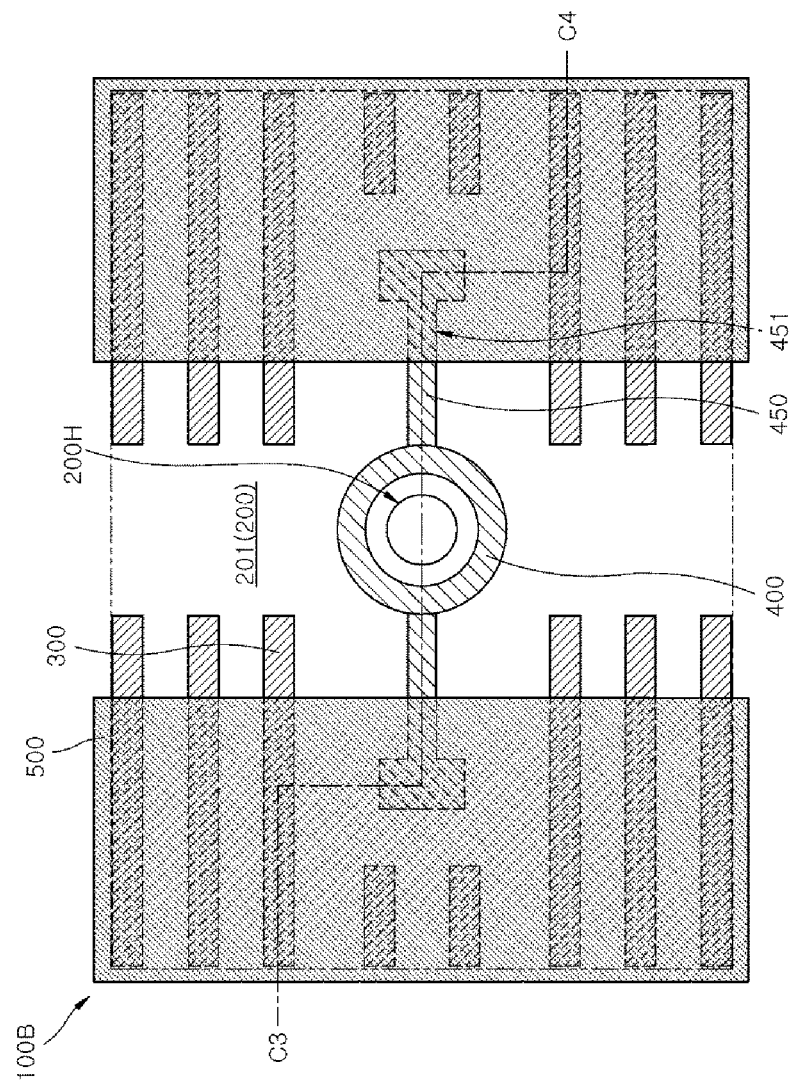
FIG. 5 is a schematic plan view illustrating a planar shape of a package substrate of a semiconductor package according to another embodiment of the present disclosure.
Figure 6:
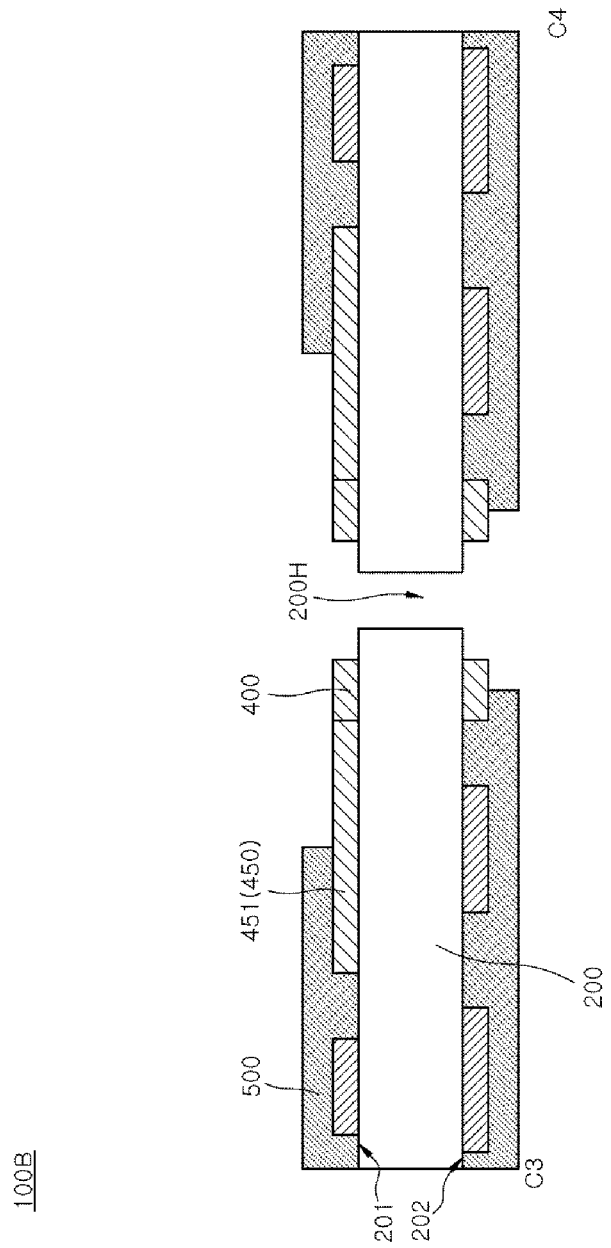
FIG. 6 is a schematic cross-sectional view illustrating a cross-sectional shape of a package substrate of the semiconductor package of FIG. 5.

FIG. 5 is a schematic plan view illustrating a planar shape of a package substrate 100B of a semiconductor package according to another embodiment of the present disclosure. FIG. 6 is a schematic cross-sectional view illustrating a cross-sectional shape along a cutting line C3-C4 of the package substrate 100B of FIG. 5. In FIGS. 5 and 6, the same reference numerals as in FIGS. 1 to 4 may indicate substantially the same elements.

Referring to FIGS. 5 and 6, the package substrate 100B may include trace patterns 300, a protecting block 400, a wing pattern 450, and a solder resist layer 500 on a dielectric layer 200. The solder resist layer 500 may cover a portion of a first surface 201 of the dielectric layer 200 and leave another portion exposed. The solder resist layer 500 may extend to cover some of the trace patterns 300. The solder resist layer 500 may leave a vent hole 200H and the protecting block 400 exposed. The solder resist layer 500 may be formed to cover a portion 451 of the wing pattern 450.

Because the portion 451 of the wing pattern 450 is overlapped and covered by the solder resist layer 500, resistance to peeling of the wing pattern 450 from the first surface 201 of the dielectric layer 200 may be further increased. In addition, because the protecting block 400 is connected to the wing pattern 450, resistance to peeling of the protecting block 400 from the first surface 201 of the dielectric layer 200 may be further increased.

FIGS. 7 to 10 are schematic views illustrating process steps of manufacturing a package substrate of a semiconductor package according to an embodiment of the present disclosure. In the description to be described with reference to FIGS. 7 to 10, elements the same as those described with reference to FIGS. 1 to 6 may refer to substantially the same elements.

Figure 7:
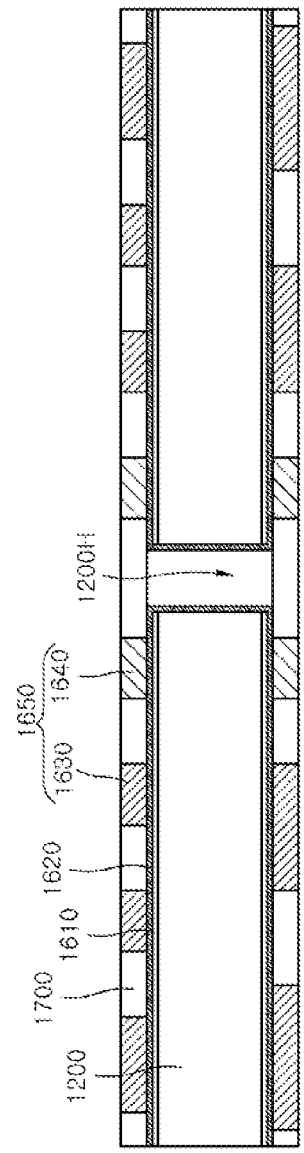
FIGS. 7 to 10 are schematic views illustrating process steps of manufacturing a package substrate of a semiconductor package according to an embodiment of the present disclosure.

Referring to FIG. 7, a vent hole 1200H may be formed in a dielectric layer 1200 on which a base layer 1610 is formed. The base layer 1610 may be laminated to the dielectric layer 1200. The dielectric layer 1200 on which the base layer 1610 is formed may be introduced in the form of a copper clad laminate (CCL) in which a copper film is laminated. The vent hole 1200H may be formed by mechanical drilling or laser drilling.

A seed layer 1620 may be formed on the base layer 1610. The seed layer 1620 may extend to cover a sidewall of the vent hole 1200H. The seed layer 1620 may be formed by a plating process. The seed layer 1620 may be formed by a chemical copper plating process of plating a copper layer. A plating mask 1700 may be formed on the seed layer 1620. The plating mask 1700 may be formed by attaching a dry film on the seed layer 1620, exposing the dry film to ultraviolet light, and developing the dry film.

A plating process may be performed on portions of the seed layer 1620 exposed by the plating mask 1700. Plating patterns 1650 may be grown or plated from the exposed portions of the seed layer 1620. The plating patterns 1650 may include first plating patterns 1630 and a second plating pattern 1640. The first plating patterns 1630 may be some elements constituting the trace patterns 300 of FIG. 1. The second plating pattern 1640 may be an element constituting the protecting block 400 of FIG. 1.

Figure 8:
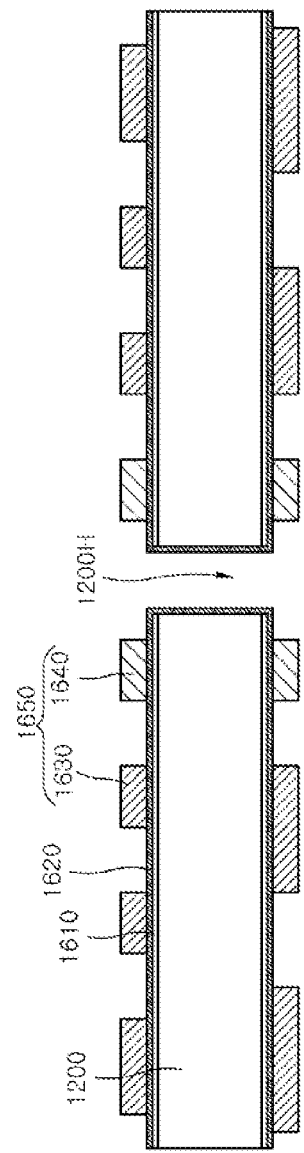

Referring to FIG. 8, the plating mask (1700 of FIG. 7) may be selectively removed. Portions of the seed layer 1620 overlapping with the plating mask 1700 may be exposed. The vent hole 1200H portion may be exposed.

Figure 9:
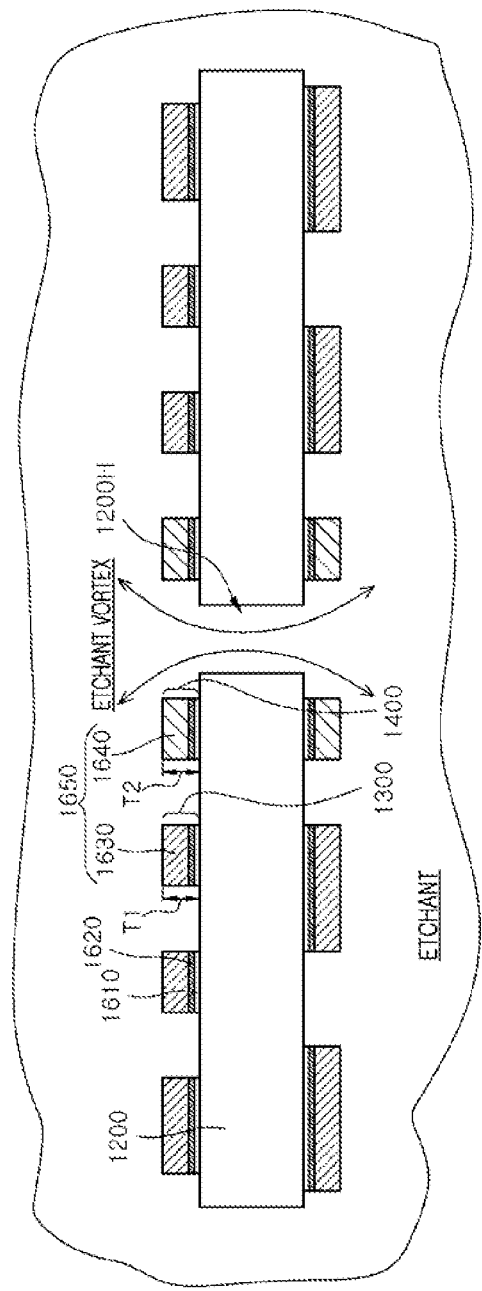
Figure 10:
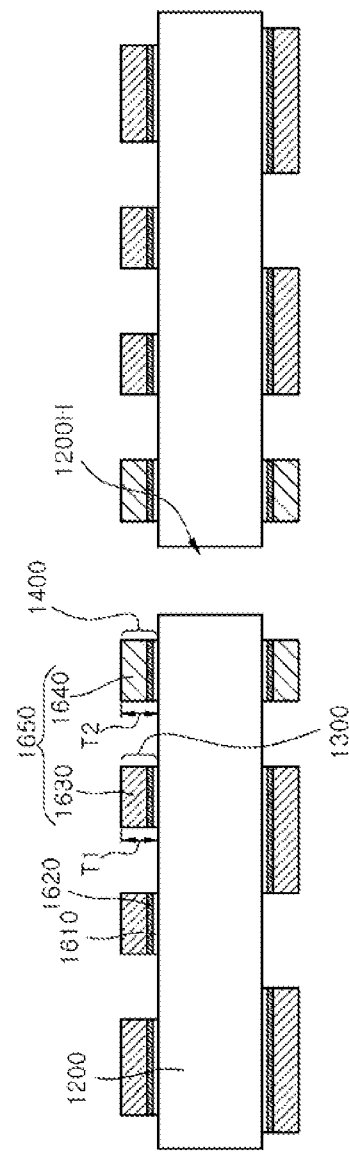

Referring to FIG. 9, the portions of the seed layer 1620 exposed by the plating patterns 1650 may be selectively removed. While the portions of the seed layer 1620 exposed by the plating patterns 1650 are removed, the portions of the base layer 1610 that are subsequently exposed may also be selectively removed. As illustrated in FIG. 10, the remaining portions of the base layer 1610, the remaining portions of the seed layer 1620, and the plating patterns 1650 remaining in the selective removal process step may constitute trace patterns 1300 and a protecting block 1400. The trace patterns 1300 and the protecting block 1400 may include metal patterns having substantially the same thickness. The trace patterns 1300 and the protecting block 1400 include the remaining portions of the base layer 1610, the remaining portions of the seed layer 1620, and the plating patterns 1650; therefore, the thickness T1 of the trace pattern 1300 and the thickness T2 of the protecting block 1400 may be substantially the same.

Referring to FIG. 9 again, a process step of removing the exposed portions of the seed layer 1620 and the exposed portions of the base layer 1610 may be performed by a wet etching process step using an etchant. The wet etching process step may be performed to provide an etchant in a solution form to the dielectric layer 1200, wherein the plating mask (1700 in FIG. 7) has been removed from the seed layer 1620, and to remove the exposed portions of the seed layer 1620 and the exposed portions of the base layer 1610 by the etchant. The plating patterns 1650 as well as the base layer 1610 or the seed layer 1620 may be etched and consumed by the etchant.

In the wet etching process step, the structural environment in which the vent hole 1200H is formed may cause an etchant flow around or through the vent hole 1200H. Such an etchant flow may be affected by the structure in which the vent hole 1200H is formed or the structural environment by such a structure. Accordingly, an etchant vortex may be generated around the vent hole 1200H. The vortex phenomenon of the etchant may cause excessive over-loss in the plating patterns 1650 adjacent to the vent hole 1200H.

The second plating pattern 1640 constituting the protecting block 1400 is disposed adjacent to the vent hole 1200H and surrounds the vent hole 1200H. Accordingly, the etchant vortex may consume a portion of the second plating pattern 1640. The protecting block 1400 may block the etchant vortex, thereby preventing the etchant vortex from reaching the trace patterns 1300 disposed farther than the protecting block 1400 from the vent hole 1200H. The protecting block 1400 may structurally prevent the etchant vortex from excessively etching or excessively consuming the trace patterns 1300.

Figure 11:
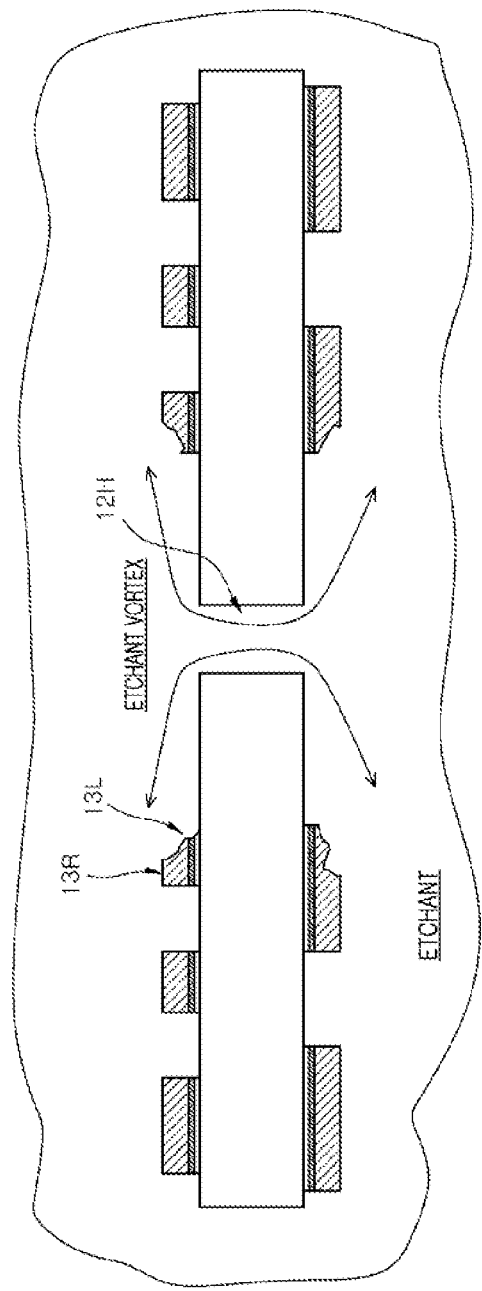
FIG. 11 is a schematic view illustrating that a damage is induced in a trace pattern according to a comparative example.

FIG. 11 is a schematic view illustrating that damage 13L is induced in a trace pattern 13R according to a comparative example.

Referring to FIG. 11, if the protecting block (1400 of FIG. 10) is not introduced and the trace pattern 13R is directly adjacent to the vent hole 12H, the trace pattern 13R may be directly exposed to the etchant vortex phenomenon caused by the vent hole 12H. When an etchant vortex reaches the trace pattern 13R, damage 13L, in which the trace pattern 13R is excessively etched and consumed, may be induced. The protecting block (1400 of FIG. 10) may serve as a barrier to prevent the damage 13L from being caused to the trace pattern 13R.

Figure 12:
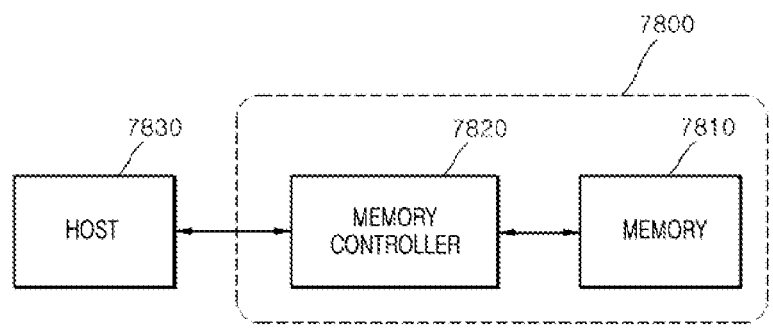
FIG. 12 is a block diagram illustrating an electronic system employing a memory card including a package according to an embodiment.

FIG. 12 is a block diagram illustrating an electronic system including a memory card 7800 employing at least one semiconductor package according to an embodiment of the present disclosure. The memory card 7800 includes a memory portion 7810, such as a nonvolatile memory device, and a memory controller 7820. The memory portion 7810 and the memory controller 7820 may store data or read out stored data. At least one of the memory portion 7810 and the memory controller 7820 may include at least one semiconductor package according to an embodiment of the present disclosure.

The memory portion 7810 may include a nonvolatile memory device to which the technology of the present disclosure is applied. The memory controller 7820 may control the memory portion 7810 such that stored data is read out or data is stored in response to a read/write request from a host 7830.

Figure 13:
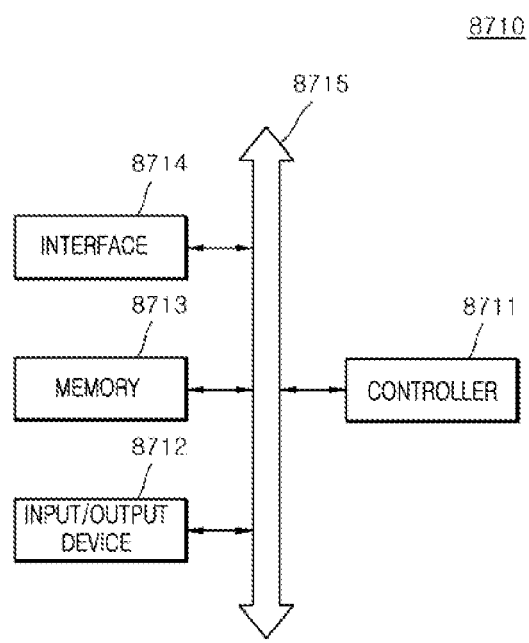
FIG. 13 is a block diagram illustrating an electronic system including a package according to an embodiment.

FIG. 13 is a block diagram illustrating an electronic system 8710 including at least one semiconductor package according to an embodiment of the present disclosure. The electronic system 8710 may include a controller 8711, an input/output device 8712, and a memory device 8713. The controller 8711, the input/output device 8712, and the memory device 8713 may be coupled with one another through a bus 8715 providing a path through which data moves.

In an embodiment, the controller 8711 may include one or more of a microprocessor, digital signal processor, microcontroller, and/or a logic device capable of performing the same functions as these components. The controller 8711 or the memory device 8713 may include at least one semiconductor package according to an embodiment of the present disclosure. The input/output device 8712 may include at least one device selected from among a keypad, a keyboard, a display device, a touchscreen, and so forth. The memory device 8713 is a device for storing data. The memory deice 8713 may store data and/or commands to be executed by the controller 8711, and the like.

The memory device 8713 may include volatile memory such as a DRAM and/or nonvolatile memory device such as a flash memory. For example, flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The present teachings have been disclosed in conjunction with some embodiments as described above. Those skilled in the art will appreciate that various modifications, additions, and/or substitutions are possible, without departing from the scope and spirit of the present disclosure. Accordingly, the embodiments disclosed in the present specification should be considered from an illustrative rather than a restrictive standpoint. The scope of the present teachings is not limited to the above descriptions but defined by the accompanying claims, and all of the distinctive features in the equivalent scope should be construed as being included in the inventive concept.

What is claimed is:

1. A semiconductor package comprising:
a semiconductor chip; and
a package substrate on which the semiconductor chip is mounted, wherein the package substrate includes:
a dielectric layer through which a vent hole penetrates;
trace patterns disposed on the dielectric layer; and
a protecting block disposed between the trace patterns and the vent hole,
wherein the protecting block and the trace patterns include the same metal material, and
wherein the protecting block spacing away from the vent hole.

2. The semiconductor package of claim 1, further comprising an encapsulation layer extending to:
cover the semiconductor chip;
fill a gap between the package substrate and the semiconductor chip; and
fill the vent hole.

3. The semiconductor package of claim 2, wherein the semiconductor chip includes conductive bumps bonded to the trace patterns to provide the gap between the package substrate and the semiconductor chip.

4. The semiconductor package of claim 1, wherein the protecting block has a ring pattern surrounding the vent hole.

5. The semiconductor package of claim 1, wherein the protecting block is disposed on the dielectric layer to be spaced apart from the trace patterns, and is electrically isolated from the trace patterns.

6. The semiconductor package of claim 1, further comprising a wing pattern extending from the protecting block in a direction in which the trace patterns extend from the protecting block.

7. The semiconductor package of claim 1, wherein the protecting block and the trace patterns are formed as plating patterns.

8. The semiconductor package of claim 1, wherein the protecting block and the trace patterns include metal patterns having the same thickness.

9. The semiconductor package of claim 1, wherein the protecting block is disposed on a same surface of the dielectric layer as the trace patterns.

10. A semiconductor package comprising:
a semiconductor chip; and
a package substrate on which the semiconductor chip is mounted, wherein the package substrate includes:
a dielectric layer through which a vent hole penetrates;
trace patterns disposed on the dielectric layer;
a protecting block disposed between the trace patterns and the vent hole;
a wing pattern extending from the protecting block in a direction in which the trace patterns extend from the protecting block; and
a solder resist layer covering a portion of the wing pattern and some of the trace patterns while leaving the vent hole and the protecting block exposed.

11. A package substrate for a semiconductor package, the package substrate comprising:
a dielectric layer through which a vent hole penetrates;
trace patterns disposed on the dielectric layer; and
a protecting block disposed between the trace patterns and the vent hole,
wherein the protecting block and the trace patterns include the same metal material, and wherein the protecting block spacing away from the vent hole.

12. The package substrate of claim 11, wherein the protecting block has a ring pattern surrounding the vent hole.

13. The package substrate of claim 11, wherein the protecting block is disposed on the dielectric layer to be spaced apart from the trace patterns, and is electrically isolated from the trace patterns.

14. The package substrate of claim 11, further comprising a wing pattern extending from the protecting block in a direction in which the trace patterns extend from the protecting block.

15. The package substrate of claim 11, wherein the protecting block and the trace patterns are formed as plating patterns.

16. The package substrate of claim 11, wherein the protecting block and the trace patterns include metal patterns having the same thickness.

17. The package substrate of claim 11, wherein the protecting block is disposed on a same surface of the dielectric layer as the trace patterns.

18. A package substrate for a semiconductor package, the package substrate comprising:
a dielectric layer through which a vent hole penetrates;
trace patterns disposed on the dielectric layer;
a protecting block disposed between the trace patterns and the vent hole;
a wing pattern extending from the protecting block in a direction in which the trace patterns extend from the protecting block; and
a solder resist layer covering a portion of the wing pattern and some of the trace patterns while leaving the vent hole and the protecting block exposed.

* * * * *